US005821150A

United States Patent [19]
Prall et al.

[11] Patent Number: 5,821,150
[45] Date of Patent: Oct. 13, 1998

[54] METHOD OF FORMING A RESISTOR AND INTEGRATED CIRCUITRY HAVING A RESISTOR CONSTRUCTION

[75] Inventors: Kirk Prall; Pierre C. Fazan; Aftab Ahmad; Howard E. Rhodes; Werner Juengling; Pai-Hung Pan; Tyler Lowrey, all of Boise, Id.

[73] Assignee: Micron Technology, Inc., Boise, Id.

[21] Appl. No.: 954,970

[22] Filed: Oct. 20, 1997

Related U.S. Application Data

[63] Continuation of Ser. No. 679,945, Jul. 15, 1996, abandoned, which is a continuation of Ser. No. 539,876, Oct. 6, 1995, abandoned.

[51] Int. Cl.⁶ .............................................. H01L 21/8234
[52] U.S. Cl. ................. 438/238; 438/384; 148/DIG. 136
[58] Field of Search ............................... 437/60, 918, 47, 437/46; 438/238, 384; 148/DIG. 136

[56] References Cited

U.S. PATENT DOCUMENTS

| | | | |
|---|---|---|---|
| 3,729,662 | 4/1973 | Langdon | 257/536 |
| 4,292,728 | 10/1981 | Endo | 29/571 |
| 4,432,008 | 2/1984 | Maltiel | 257/379 |
| 4,497,106 | 2/1985 | Momma et al. | 29/571 |
| 4,898,837 | 2/1990 | Takeda et al. | 437/31 |
| 4,912,053 | 3/1990 | Schrantz | 437/29 |
| 5,037,766 | 8/1991 | Wang | 437/918 |
| 5,059,549 | 10/1991 | Furuhata | 437/59 |
| 5,120,572 | 6/1992 | Kumar | 437/60 |
| 5,168,076 | 12/1992 | Godinho et al. | 437/60 |
| 5,200,358 | 4/1993 | Bollinger et al. | 437/180 |
| 5,210,438 | 5/1993 | Nakamura | 257/536 |
| 5,235,312 | 8/1993 | Sandhu et al. | 437/918 |
| 5,244,835 | 9/1993 | Hachiya | 437/186 |
| 5,275,963 | 1/1994 | Cederbaum et al. | 437/48 |
| 5,364,817 | 11/1994 | Lur | 438/644 |
| 5,424,239 | 6/1995 | Sweeney | 437/60 |
| 5,485,138 | 1/1996 | Morris | 437/60 |
| 5,489,547 | 2/1996 | Erdeljac et al. | 437/60 |
| 5,668,037 | 9/1997 | Prall et al. | 438/238 |

FOREIGN PATENT DOCUMENTS

| | | | |
|---|---|---|---|
| 57-196573 | 12/1982 | Japan | 437/162 |
| 60-231354 | 11/1985 | Japan | 437/60 |

OTHER PUBLICATIONS

Wolf, Stanley Ph.D., "Appendix A—IC Resistor Fabrication", *Silicon Processing For The VLSI ERA vol. 2 Process Integration*, Lattice Press, 1990, pp.731–736.

*Primary Examiner*—Michael Trinh
*Attorney, Agent, or Firm*—Wells, St. John, Roberts, Gregory & Matkin, P.S.

[57] ABSTRACT

A method of forming a resistor from semiconductive material includes, a) providing a substrate; b) providing a layer of semiconductive material over the substrate; c) providing a pair of openings into the semiconductive material layer; d) plugging the pair of openings with an electrically conductive material to define a pair of electrically conductive pillars within the semiconductive material, the pair of pillars having semiconductive material extending therebetween to provide a resistor construction; and e) providing a conductive node to each of the electrically conductive pillars. An integrated circuit incorporating a resistor construction includes, i) a layer of semiconductive material; ii) a pair of electrically conductive pillars provided within the semiconductive material layer, the pair of pillars being separated from one another and thereby having a mass of the semiconductive material extending therebetween; and iii) an electrically conductive node in electrical connection with each of the respective conductive pillars. Alternately, a resistor is provided within a semiconductive substrate using different concentration diffusion regions.

20 Claims, 5 Drawing Sheets

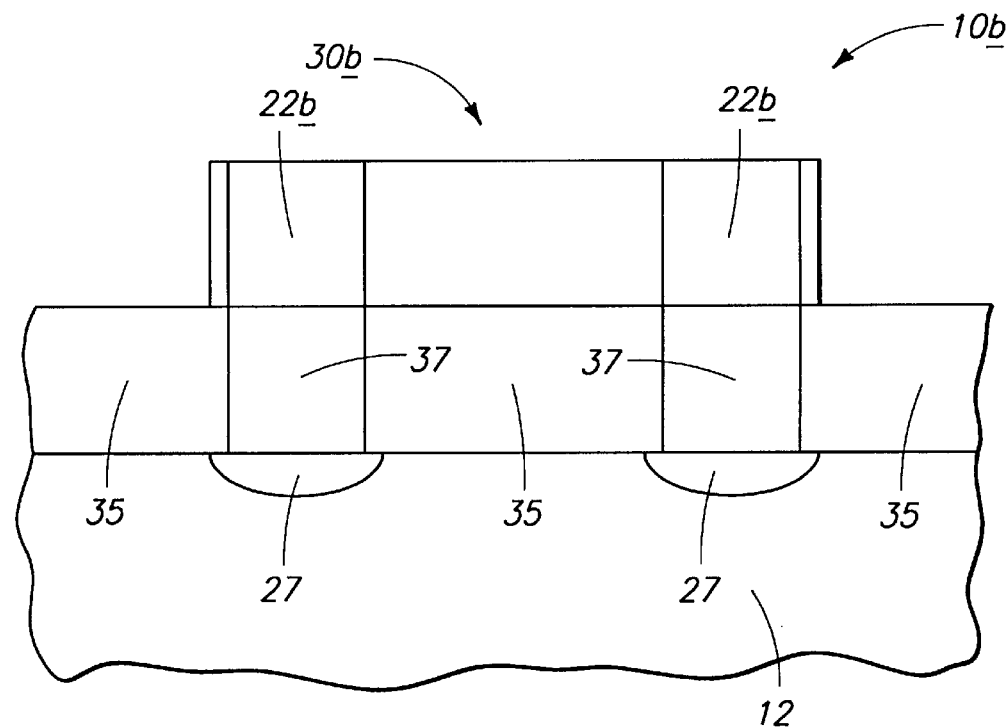
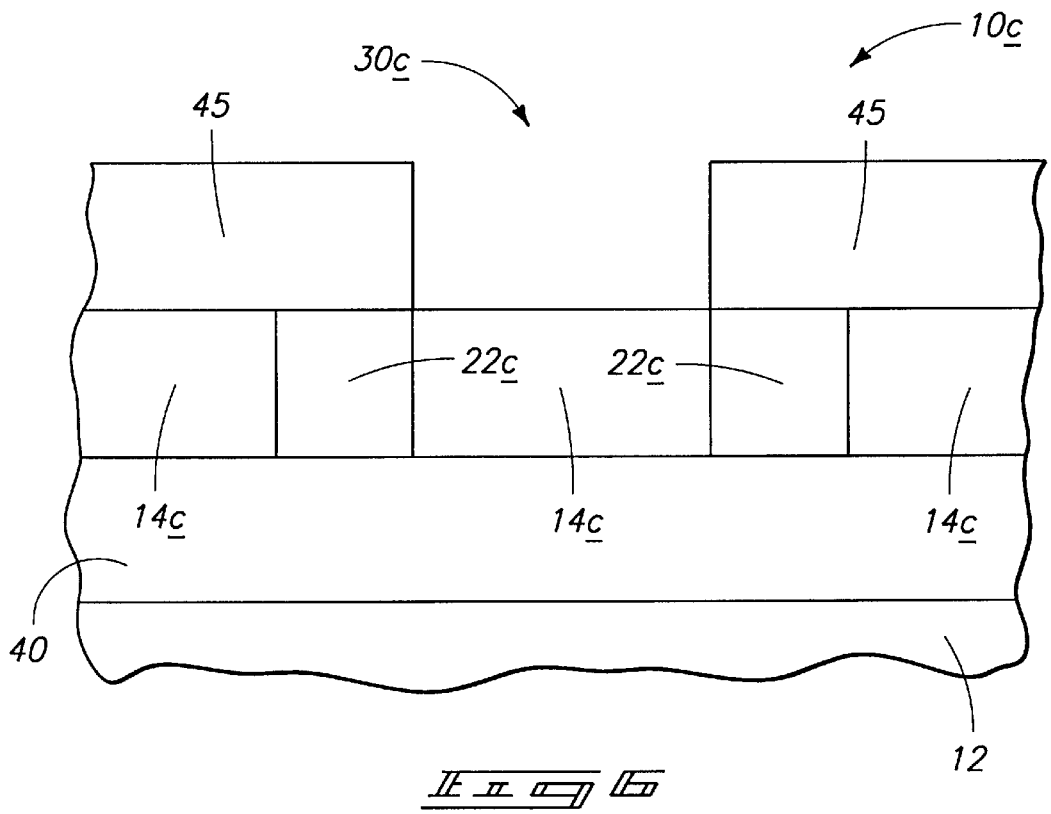
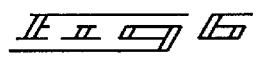

METHOD OF FORMING A RESISTOR AND INTEGRATED CIRCUITRY HAVING A RESISTOR CONSTRUCTION

RELATED PATENT DATA

This patent resulted from a file wrapper continuation application of prior application Ser. No. 08/679,945, filed on Jul. 15, 1996, now abadoned entitled "Method of Forming a Resistor and Integrated Circuitry Having a Resistor Construction," and naming as inventors Kirk Prall, Pierre C. Fazan, Aftab Ahmad, Howard E. Rhodes, Werner Juengling, Pai-Hung Pan, and Tyler Lowrey. That application was a file wrapper continuation of application Ser. No. 08/539,876, filed on Oct. 6, 1995, now abandoned, entitled "Method of Forming a Resistor and Integrated Circuitry Having a Resistor Construction," and naming as inventors Kirk Prall, Pierre C. Fazan, Aftab Ahmad, Howard E. Rhodes, Werner Juengling, Pai-Hung Pan, and Tyler Lowrey. This application is also related to application Ser. No. 08/679,705, filed Jul. 11, 1996, U.S. Pat. No. 5,668,037, entitled "Method of Forming a Resistor and Integrated Circuitry Having a Resistor Construction", and naming as inventors Kirk Prall, Pierre C. Fazan, Aftab Ahmad, Howard E. Rhodes, Werner Juengling, Pai-Hung Pan, and Tyler Lowrey. This application is also related to application Ser. No. 08/680,332, filed Jul. 11, 1996, U.S. Pat. No. 5,668,037, entitled "Method of Forming a Resistor and Integrated Circuitry Having a Resistor Construction," and naming as inventors Kirk Prall, Pierre C. Fazan, Aftab Ahmad, Howard E. Rhodes, Werner Juengling, Pai-Hung Pan, and Tyler Lowrey.

TECHNICAL FIELD

This invention relates generally to semiconductor processing methods of forming resistors from semiconductive material, and to integrated circuitry incorporating resistors.

BACKGROUND OF THE INVENTION

Resistors in integrated circuitry are typically implemented using either diffused regions in a semiconductor substrate, such as silicon, or provided in deposited thin-films.

This invention comprises novel methods of forming resistors, and novel integrated circuitry incorporating resistors.

BRIEF DESCRIPTION OF THE DRAWINGS

Preferred embodiments of the invention are described below with reference to the following accompanying drawings.

FIG. 5 is a diagrammatic cross sectional view of yet another alternate embodiment semiconductor wafer fragment in accordance with the invention.

FIG. 6 is a diagrammatic cross sectional view of still another alternate embodiment semiconductor wafer fragment in accordance with the invention.

DETAILED DESCRIPTION OF THE PREFERRED EMBODIMENTS

Figure 1:
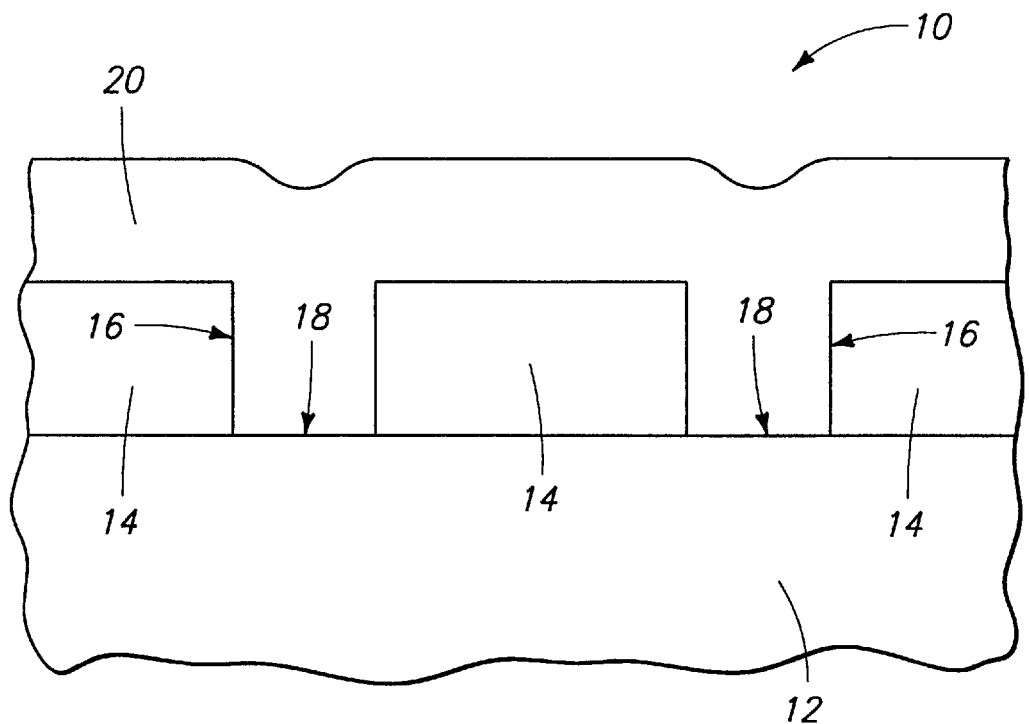
FIG. 1 is a diagrammatic cross sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a method of forming a resistor from semiconductive material comprises the following steps:

providing a substrate;

providing a layer of semiconductive material over the substrate;

providing a pair of openings into the semiconductive material layer;

plugging the pair of openings with an electrically conductive material to define a pair of electrically conductive pillars within the semiconductive material, the pair of pillars having semiconductive material extending therebetween to provide a resistor construction; and providing a conductive node to each of the electrically conductive pillars.

In accordance with another aspect of the invention, an integrated circuit comprises:

a layer of semiconductive material;

a pair of electrically conductive pillars provided within the semiconductive material layer, the pair of pillars being separated from one another and thereby having a mass of the semiconductive material extending therebetween; and an electrically conductive node in electrical connection with each of the respective conductive pillars.

In accordance with still a further aspect of the invention, a method of forming a resistor from semiconductive material comprises:

providing a semiconductive substrate;

providing a conductivity enhancing impurity of a first type into a first region of the semiconductive substrate to a first electrically resistive dopant concentration;

providing a spaced pair of second diffusion regions of conductivity enhancing impurity of the first type within the semiconductive substrate to a second electrically conductive dopant concentration, the spaced second diffusion regions contacting the first region and having first region semiconductive material extending therebetween;

providing an insulating layer outwardly of the semiconductive substrate over the first region;

providing a pair of openings into the insulative layer to the semiconductive substrate, the respective openings overlying the pair of second regions; and plugging the pair of openings with an electrically conductive material.

In accordance with another aspect of the invention, an integrated circuit comprises:

a semiconductive substrate;

a first diffusion region of a conductivity enhancing impurity of a first type within the semiconductive substrate having a first electrically resistive dopant concentration;

a spaced pair of second diffusion regions of conductivity enhancing impurity of the first type within the semiconductive substrate having a second electrically conductive dopant concentration, the spaced second diffusion regions contacting the first diffusion region and having first diffusion region semiconductive material extending therebetween;

an insulating layer outwardly of the semiconductive substrate over the first diffusion region; and a pair of electrically conductive plugs provided through the insulating layer over and in electrical connection with the second diffusion regions.

These and other aspects of the invention will be appreciated from the following description with respect to several preferred embodiments.

Referring to FIG. 1, a semiconductor wafer fragment in process is indicated generally with reference numeral 10. Such comprises a bulk semiconductive substrate 12, typically comprising lightly doped monocrystalline silicon. A layer 14 of semiconductive material is provided over substrate 12. A typical and preferred material is silicon, such as polysilicon, having a conductivity enhancing dopant concentration of less than or equal to $1\times10^{19}$ ions/cm$^3$. A preferred conductivity enhancing dopant concentration for layer 14 is from $1\times10^{15}$ ions/cm$^3$ to $1\times10^{19}$ ions/cm$^3$. An example preferred thickness for layer 14 is 1000 Angstroms to 5000 Angstroms. Layer 14 has been patterned to provide a pair of openings 16 into and through semiconductive material layer 14 to substrate 12. Openings 16 define respective opening bases 18 where openings 16 meet semiconductive substrate 12.

A layer 20 of electrically conductive material is provided over layer 14 to a thickness at least twice as wide as openings 16 to plug such openings 16. An example thickness for layer 20 is 3000 Angstroms to 8000 Angstroms. One example preferred material for layer 20 is polysilicon having a conductivity dopant concentration of at least $1\times10^{20}$ ions/cm$^3$. An alternate preferred material is tungsten.

Figure 2:
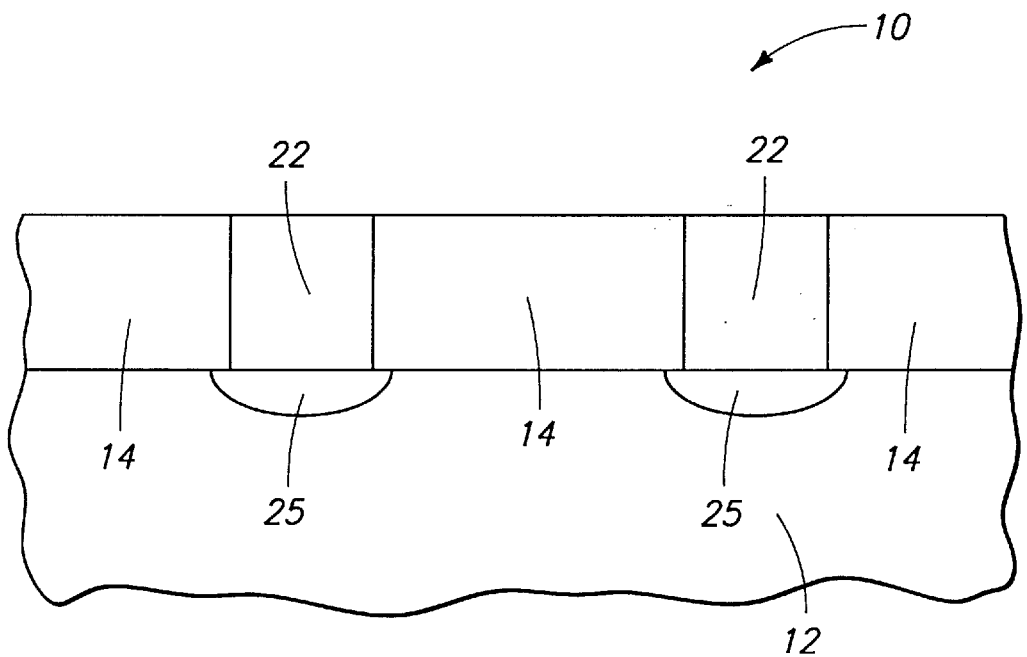
FIG. 2 is a view of the FIG. 1 wafer at a processing step subsequent to that shown by FIG. 1.

Referring to FIG. 2, layer 20 is etched back, either by resist etch back or chemical-mechanical polishing (CMP), to effectively define a pair of electrically conductive pillars 22 of material 20 within semiconductive material 14. Thus, pillars 22 have semiconductive material of layer 14 extending therebetween to provide a predefined resistance path between pillars 22, and thus a resistor construction. The upper surfaces of pillars 22 are flush with the upper surface of semiconductive layer 14. Conductive nodes 25 are provided within semiconductive substrate 12 at bases 18 of each opening 16. The illustrated and preferred technique by which such conductive diffusion regions are provided is substantially by out-diffusion of conductivity enhancing dopant impurity from polysilicon plugging material 22.

Figure 3:
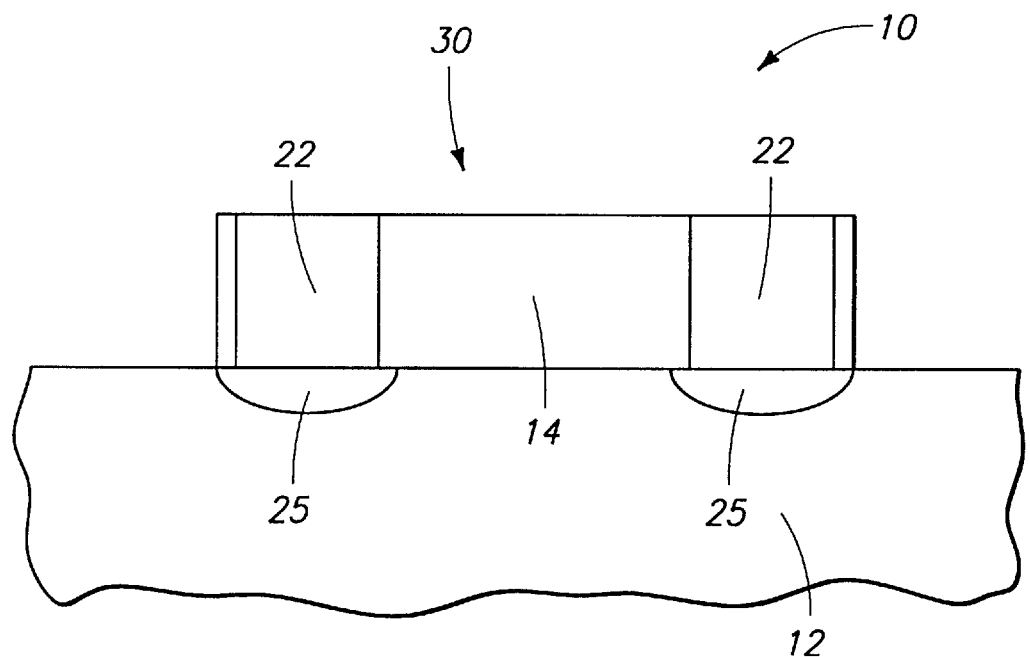
FIG. 3 is a view of the FIG. 1 wafer at a processing step subsequent to that shown by FIG. 2.

Referring to FIG. 3, semiconductive material layer 14 is patterned into a desired resistor shape 30, with the shape comprising the pair of pillars 22 having semiconductive material 14 extending therebetween. Thus, an integrated circuit comprising a resistor construction is provided. Such comprises a layer of semiconductive material, and a pair of electrically conductive pillars provided therewithin. The pair of pillars is separated from one another, and thereby has a mass of the semiconductor material extending therebetween. Electrically conductive nodes, in the form of diffusion regions 25, are in electrical connection with each of the respective conductive pillars.

Figure 4:
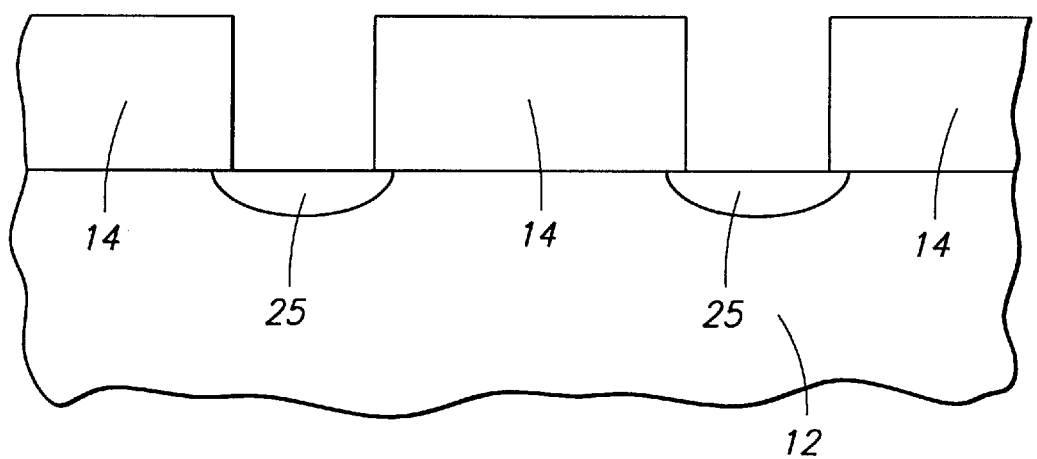
FIG. 4 is a diagrammatic cross sectional view of an alternate embodiment semiconductor wafer fragment at a processing step in accordance with the invention.

FIG. 4 illustrates an alternate embodiment wafer fragment 10*a*. Here, substrate nodes 25 are provided by a conductivity enhancing doping into substrate 12 through openings 16 prior to the plugging of openings 16.

FIG. 5 illustrates yet another alternate embodiment wafer fragment 10*b*. Here, a resistor construction 30*b* is provided atop a substrate comprising a layer 35 of borophosphosilicate (BPSG). A pair of separate pillars 37, preferably comprising either conductively doped polysilicon or tungsten, is provided through layer 35 to a pair of nodes 27 formed within bulk substrate 12. Pillars 37 constitute nodes which respectively connect to resistor pillars 22*b*.

FIG. 6 illustrates yet another alternate embodiment wafer fragment 10*c*. Such comprises a bulk substrate 12 and overlying BPSG layer 40. A layer 14*c* of semiconductive material is provided atop substrate layer 40, and includes a pair of spaced electrically conductive pillars 22*c*. Nodes to pillar 22*c* are provided in the form of a separately provided and patterned interconnect line 45, which is effectively bridged by the illustrated resistor construction 30*c*. Layer 14*c* would be patterned to be discontinuous out of the figure to define a discrete resistor shape.

Figure 7:
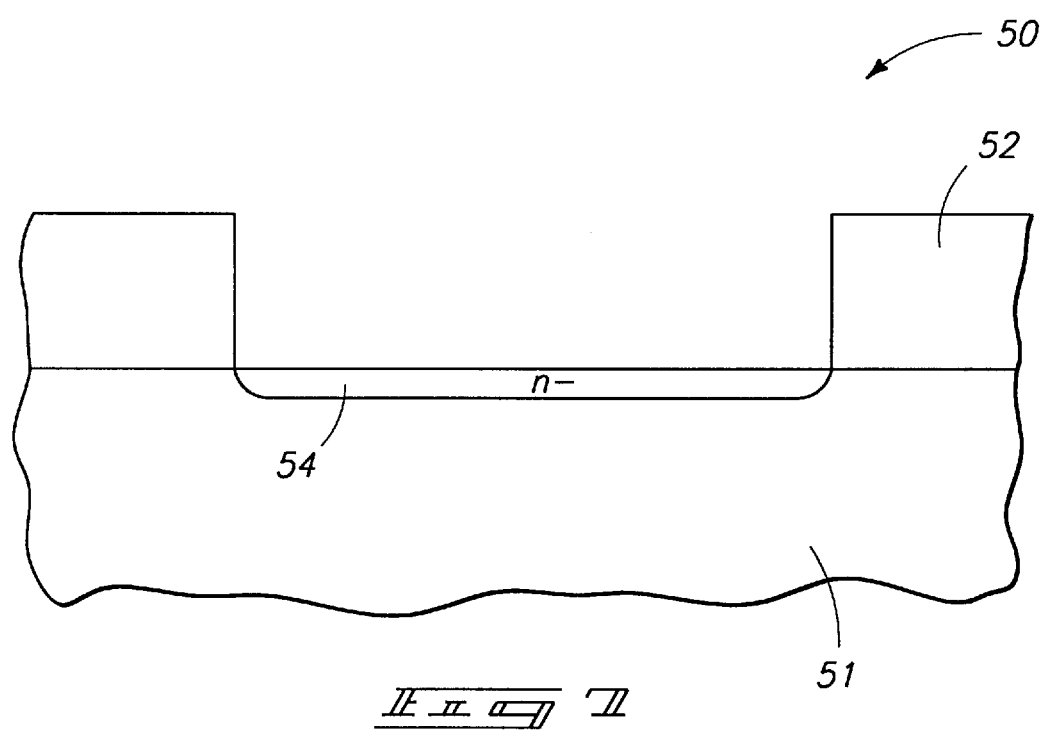
FIG. 7 is a diagrammatic cross sectional view of a further alternate embodiment semiconductor wafer fragment at a processing step in accordance with the invention.

Another inventive embodiment is described with reference to FIGS. 7 and 8. FIG. 7 illustrates a semiconductor wafer fragment 50 comprised of a bulk substrate 51. A layer 52 of photoresist is provided and patterned as shown, and a first diffusion region 54 of a conductivity enhancing impurity of a first type is provided within substrate 51. The illustrated and example conductivity-type impurity is n-type material provided to a first electrically resistive n– dopant 4 concentration, such as preferably less than or equal to $1\times10^{19}$ ions/cm$^3$ peak dopant concentration.

Figure 8:
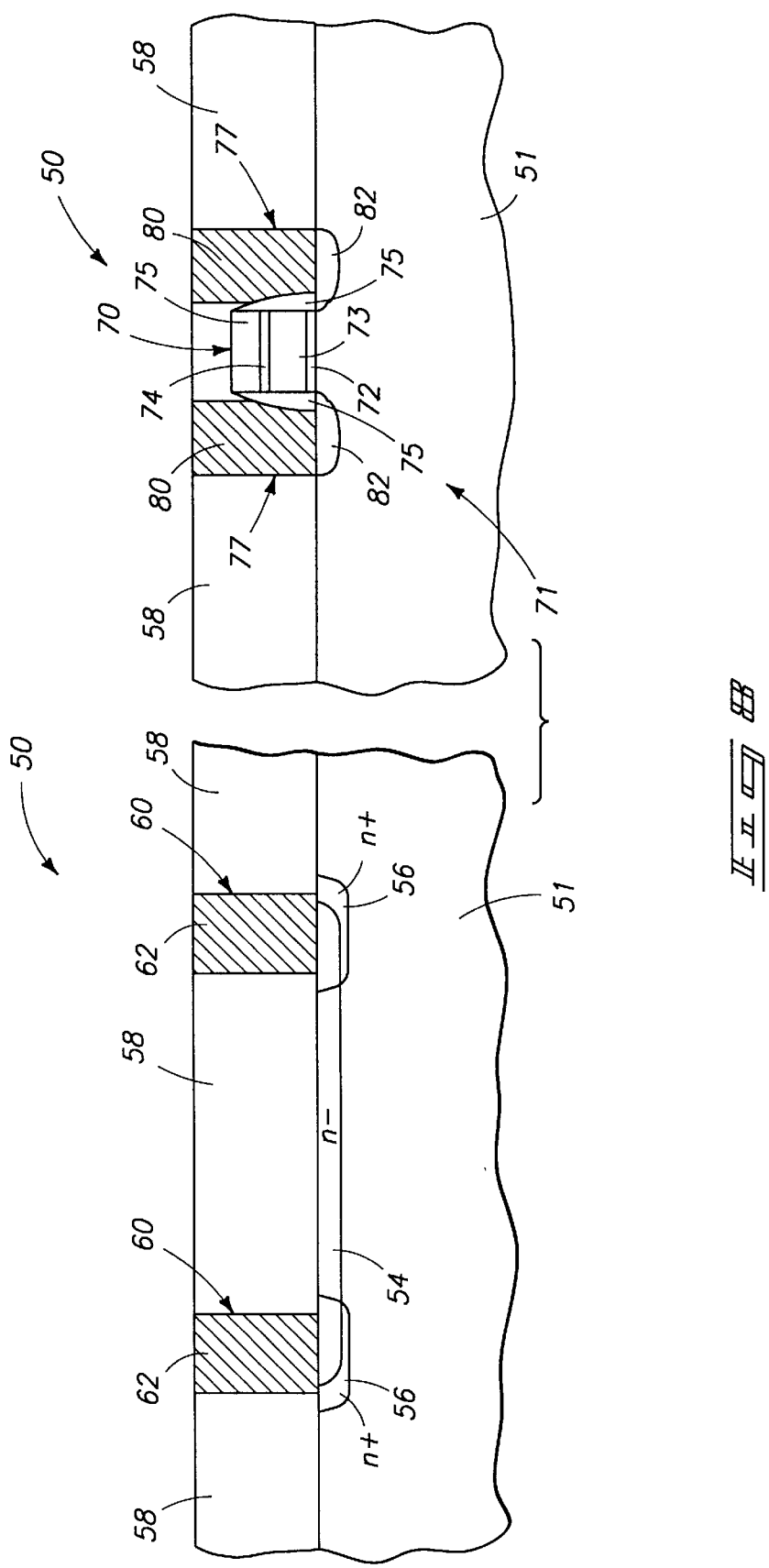
FIG. 8 is an expanded view of the FIG. 7 wafer at a processing step subsequent to that shown by FIG. 7.

Referring to FIG. 8, and initially to the left fragmentary portion of FIG. 8, a spaced pair 56 of second diffusion regions of conductivity enhancing impurity of the first type is provided within semiconductive substrate 51. Second diffusion regions 56 are provided to a second electrically conductive dopant concentration, with an example being at least $1\times10^{20}$ ions/cm$^3$. As shown, spaced second diffusion regions 56 contact first diffusion region 54 by overlapping such regions, and accordingly have first diffusion region semiconductive material extending therebetween. Accordingly, region 54 constitutes an expanse of resistive material between higher conductive regions 56. An insulating layer 58 is provided outwardly of semiconductive substrate 51 over first diffusion region 54. A pair of contact openings 60 are provided into insulating layer 58 to semiconductive substrate 51, and overlie second diffusion regions 56. A pair of electrically conductive plugs 62 are provided within contact openings 60 for electrical connection with highly doped diffusion regions 56. Example and preferred materials for plug 62 include tungsten or highly conductively doped polysilicon.

Diffusion regions 56 might be provided by a number of different manners. One example would provision of diffusion regions 56 essentially entirely by out-diffusion of first conductivity-type material from electrically conductive plugs 62. Alternately, spaced second diffusion regions 56 might be provided prior to the provision of insulating layer 58. For example, the substrate of FIG. 7 could have photoresist layer 52 stripped, and a subsequent layer of photoresist provided. Such subsequent layer could be patterned to provide openings for providing heavy dopant implants to produce regions 56. Further alternately, regions 56 might be provided by implanting through openings 60 after provision of layer 58 and prior to providing conductive plugging material 62.

The right fragmentary portion of FIG. 8 is intended to illustrate processing elsewhere on wafer fragment 50 at least some of which occurs during the same steps as the processing of the illustrated left fragmentary portion. Specifically, a transistor gate 70 in a second region 71 of semiconductive substrate 51 is provided prior to providing insulating layer 58. Gate 71 comprises a gate oxide layer 72, conductive polysilicon layer 73 and higher conductive silicide cap 74. Gate 71 is encapsulated by an insulating material 75 which is selectively etchable relative to insulative layer 58. An example and preferred material, where layer 58 comprises oxide, is $Si_3N_4$. Insulative layer 58 is subsequently provided over insulative material 75 and gate 70.

The step of providing pair of openings 60 for the left portion of FIG. 8 also preferably comprises in the same step etching a pair of contact openings 77 through insulative layer 58 to semiconductive substrate 51 adjacent gate 58 in a manner substantially selective relative to encapsulating insulative material 75. An example etch chemistry where insulative layer 58 is oxide and material 75 is nitride would utilize a combination of $CF_4$, $CHF_3$, Ar, and $CH_2F_2$. A pair of electrically conductive plugs 80 are provided within contact openings 77. Such is preferably accomplished in the same step and in the same manner as provision of plugs 62 within openings 60. A pair of substrate diffusion regions 82 are provided in any of the same manners by which diffusion regions 56 are provided.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a resistor atop a substrate comprising the following steps:
    forming a layer of semiconductive material over the substrate;
    forming a pair of openings into the semiconductive material layer;
    plugging the pair of openings with an electrically conductive material to define a pair of electrically conductive resistor electrodes within the semiconductive material, the pair of resistor electrodes having semiconductive material extending therebetween to provide a resistor construction; and
    forming a conductive node to each of the electrically conductive resistor electrodes.

2. The method of forming a resistor of claim 1 wherein the layer of semiconductive material is formed to have an upper surface, the plugging step comprising depositing the electrically conductive material over the semiconductive material layer and etching back the electrically conductive material to define the resistor electrodes, the electrodes having an upper surface which is elevationally coincident with the semiconductive material layer.

3. The method of forming a resistor of claim 1 wherein the semiconductive material is silicon having a conductivity enhancing dopant concentration of less than or equal to $1\times10^{19}$ ions/cm$^3$.

4. The method of forming a resistor of claim 1 wherein the electrically conductive plugging material comprises polysilicon having a conductivity enhancing dopant concentration of at least $1\times10^{20}$ ions/cm$^3$.

5. The method of forming a resistor of claim 1 wherein the electrically conductive plugging material comprises tungsten.

6. The method of forming a resistor of claim 1 wherein the semiconductive material is silicon having a conductivity enhancing dopant concentration of less than or equal to $1\times10^{19}$ ions/cm$^3$, and the electrically conductive plugging material comprises polysilicon having a conductivity enhancing dopant concentration of at least $1\times10^{20}$ ions/cm$^3$.

7. A method of forming a resistor atop a substrate comprising the following steps:
    forming a layer of semiconductive material over the substrate;
    forming a pair of openings into the semiconductive material layer;
    plugging the pair of openings with an electrically conductive material to define a pair of electrically conductive resistor electrodes within the semiconductive material;
    forming a conductive node to each of the resistor electrodes; and
    patterning the semiconductive material layer into a desired resistor shape, the shape comprising the pair of resistor electrodes having semiconductive material of the semiconductive material layer extending therebetween.

8. The method of forming a resistor of claim 7 wherein the layer of semiconductive material is formed to have an upper surface, the plugging step comprising depositing the electrically conductive material over the semiconductive material layer and etching back the electrically conductive material to define the resistor electrodes, the electrodes having an upper surface which is elevationally coincident with the semiconductive material layer.

9. The method of forming a resistor of claim 7 wherein the semiconductive material is silicon having a conductivity enhancing dopant concentration of less than or equal to $1\times10^{19}$ ions/cm$^3$.

10. The method of forming a resistor of claim 7 wherein the electrically conductive plugging material comprises polysilicon having a conductivity enhancing dopant concentration of at least $1\times10^{20}$ ions/cm$^3$.

11. The method of forming a resistor of claim 7 wherein the electrically conductive plugging material comprises tungsten.

12. The method of forming a resistor of claim 7 wherein the semiconductive material is silicon having a conductivity enhancing dopant concentration of less than or equal to $1\times10^{19}$ ions/cm$^3$, and the electrically conductive plugging material comprises polysilicon having a conductivity enhancing dopant concentration of at least $1\times10^{20}$ ions/cm$^3$.

13. A method of forming a resistor atop a semiconductive substrate comprising the following steps:
    forming a layer of semiconductive material over the semiconductive substrate;
    forming a pair of openings into the semiconductive material layer to the substrate, the openings defining respective opening bases where the openings meet the semiconductive substrate;
    plugging the pair of openings with an electrically conductive material to define a pair of electrically conductive resistor electrodes within the semiconductive material;
    forming a conductive node within the semiconductive substrate at the base of each opening; and
    patterning the semiconductive material layer into a desired resistor shape, the shape comprising the pair of resistor electrodes having semiconductive material extending therebetween.

14. The method of forming a resistor of claim 13 wherein the layer of semiconductive material is formed to have an upper surface, the plugging step comprising depositing the electrically conductive material over the semiconductive material layer and etching back the electrically conductive material to define the resistor electrodes, the electrodes having an upper surface which is elevationally coincident with the semiconductive material layer.

15. The method of forming a resistor of claim 13 wherein the electrically conductive plugging material comprises polysilicon having a conductivity enhancing dopant concentration of at least $1\times10^{19}$ ions/cm$^3$, and the substrate node is substantially provided by out-diffusion of the conductivity enhancing dopant impurity from the polysilicon plugging material.

16. The method of forming a resistor of claim 13 wherein the substrate node is substantially provided by a conductivity enhancing doping into the substrate through the pair of openings prior to the plugging step.

17. The method of forming a resistor of claim 13 wherein the semiconductive material is silicon having a conductivity enhancing dopant concentration of less than or equal to $1\times10^{19}$ ions/cm$^3$.

18. The method of forming a resistor of claim 13 wherein the electrically conductive plugging material comprises polysilicon having a conductivity enhancing dopant concentration of at least $1\times10^{20}$ ions/cm$^3$.

19. The method of forming a resistor of claim 13 wherein the electrically conductive lugging material comprises tungsten.

20. The method of forming a resistor of claim 13 wherein the semiconductive material is silicon having a conductivity enhancing dopant concentration of less than or equal to $1\times10^{19}$ ions/cm$^3$, and the electrically conductive plugging material comprises polysilicon having a conductivity enhancing dopant concentration of at least $1\times10^{20}$ ions/cm$^3$.

* * * * *

UNITED STATES PATENT AND TRADEMARK OFFICE
CERTIFICATE OF CORRECTION

PATENT NO. : 5,821,150
DATED : 10/13/98
INVENTOR(S) : Prall et al.

It is certified that error appears in the above-identified patent and that said Letters Patent is hereby corrected as shown below:

Column 4, line 26, after "n-dopant", delete "4".

Column 4, line 51, after "would", insert --be--.

Column 8, line 10, after "conductive", delete "lugging" and replace with --plugging--.

Column 1, line 27, after "U.S. Pat. No." delete "5,668,037" and replace with --5,780,920--.

Signed and Sealed this

Sixteenth Day of February, 1999

Attest:

*Attesting Officer*

*Acting Commissioner of Patents and Trademarks*